(12) United States Patent
Gupta et al.

(10) Patent No.: US 11,418,200 B2
(45) Date of Patent: Aug. 16, 2022

(54) FRACTIONAL-N PHASE LOCK LOOP (PLL) WITH NOISE CANCELATION

(71) Applicant: STMicroelectronics International N.V., Geneva (CH)

(72) Inventors: Ankit Gupta, Delhi (IN); Sagnik Mukherjee, Kolkata (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/507,221

(22) Filed: Oct. 21, 2021

(65) Prior Publication Data

US 2022/0182063 A1 Jun. 9, 2022

Related U.S. Application Data

(60) Provisional application No. 63/120,852, filed on Dec. 3, 2020.

(51) Int. Cl.
*H03L 7/089* (2006.01)
*H03L 7/087* (2006.01)
*H03L 7/197* (2006.01)

(52) U.S. Cl.
CPC ............ *H03L 7/0896* (2013.01); *H03L 7/087* (2013.01); *H03L 7/1976* (2013.01)

(58) Field of Classification Search
CPC ... H03L 7/235; H03L 7/23; H03L 7/22; H03L 7/20; H03L 7/18; H03L 7/16; H03L 7/06; H03L 7/08; H03L 7/07
See application file for complete search history.

(56) References Cited

U.S. PATENT DOCUMENTS

| 3,976,945 A | 8/1976 | Cox |
| 9,793,904 B1 * | 10/2017 | Chenakin ............... H03L 7/087 |
| 11,095,295 B2 * | 8/2021 | Monk ................... G04F 10/005 |

OTHER PUBLICATIONS

Parmarti, "Frequency/Phase Synthesis Fractional-N PLL Basics," UCLA (date unknown).

* cited by examiner

*Primary Examiner* — Diana J. Cheng
(74) *Attorney, Agent, or Firm* — Crowe & Dunlevy

(57) ABSTRACT

A PLL circuit includes a fractional-N divider generating a feedback signal, a first phase-frequency detector that compares the feedback signal to a reference signal to generate first up/down control signals that control a charge pump to generate a charge pump output current. A noise cancelation circuit includes a synchronization circuit that generates first and second synchronized feedback signals from the PLL circuit output and the feedback signal, where the first and second synchronized feedback signals are offset by an integer number of cycles of the PLL circuit output. A second phase-frequency detector circuit compares the first and second synchronized feedback clock signals to generate second up/down control signals whose pulse widths differ by the integer number of PLL cycles. A current digital to analog converter circuit is controlled in response to the second up/down control signals to apply noise canceling sourcing and sinking currents to the charge pump output current.

24 Claims, 7 Drawing Sheets

FRACTIONAL-N PHASE LOCK LOOP (PLL) WITH NOISE CANCELATION

CROSS REFERENCE TO RELATED APPLICATIONS

This application claims priority from U.S. Provisional Application for Patent No. 63/120,852, filed Dec. 3, 2020, the disclosure of which is incorporated by reference.

TECHNICAL FIELD

The present invention generally relates to a fractional-N phase lock loop (PLL) circuit and, in particular, to the cancelation of noise in the operation of the fractional-N PLL circuit.

BACKGROUND

Reference is made to FIG. 1 showing a block diagram of a fractional-N phase lock loop (PLL) circuit 10. A phase-frequency detector (PFD) circuit 12 has a first input that receives a reference clock signal CLKref(t) and a second input that receives a feedback clock signal CLKfb(t). The PFD circuit 12 measures the difference between like edges (i.e., rising edges or falling edges) of the reference clock signal CLKref(t) and the feedback clock signal CLKfb(t). In the case where the PFD circuit 12 detects that the like edges of the reference clock signal CLKref(t) and the feedback clock signal CLKfb(t) are aligned, an up signal U(t) is pulsed and a down signal D(t) is pulsed (the two pulses being synchronized and having a same duration of time). If the PFD circuit 12 detects a situation where the edge of the reference clock signal CLKref(t) leads the like edge of the feedback clock signal CLKfb(t), an up signal U(t) is pulsed for a first duration of time and the down signal D(t) is pulsed for a second duration of time (less than the first duration), where the length of the first duration is dependent on the error in phase between the like edges. Conversely, if the edge of the feedback clock signal CLKfb(t) leads the like edge of the reference clock signal CLKref(t), the PFD circuit 12 pulses the down signal D(t) for a third duration of time and pulses the up signal U(t) for a fourth duration of time (less than the third duration), where the length of the third duration is dependent on the error in phase between the like edges.

FIG. 2 shows a block diagram of an embodiment of the PFD circuit 12. The PFD circuit 12 includes a first D-type flip flop (FF) circuit 14 having a data (D) input that receives a logic high voltage (Vdd) and a clock (CLK) input that receives the reference clock signal CLKref(t). The output (Q) of the FF circuit 14 generates the up signal U(t). The PFD circuit 12 further includes a second D-type flip flop (FF) circuit 16 having a data (D) input that receives a logic high voltage (Vdd) and a clock (CLK) input that receives the feedback clock signal CLKfb(t). The output (Q) of the FF circuit 16 generates the down signal D(t). A logic AND gate 18 has a first input that receives the up signal U(t) and a second input that receives the down signal D(t). The gate 18 logically ANDs those signals to generate a reset signal that is applied to the reset inputs of the first and second FF circuits 14 and 16.

FIG. 2 further shows the waveforms for the up signal U(t) and down signal D(t) for the operational cases where: a) like edges of the reference clock signal CLKref(t) and the feedback clock signal CLKfb(t) are aligned; b) the edge of the reference clock signal CLKref(t) leads the like edge of the feedback clock signal CLKfb(t); and c) the edge of the feedback clock signal CLKfb(t) leads the like edge of the reference clock signal CLKref(t). The smaller pulse width for the up signal U(t) and down signal D(t) in cases a), b) and c) is controlled by the time delay (td) for operation of the AND gate 18 to cause the first and second FF circuits 14 and 16 to reset. This is the minimum pulse width for the up signal U(t) and down signal D(t). The longer pulse width for the up signal U(t) and the down signal D(t) in cases b) and c), respectively, is controlled as a function of the sum of the minimum pulse width (td) plus the difference in time (i.e., the phase difference—pd) between the like edges of the reference clock signal CLKref(t) and the feedback clock signal CLKfb(t).

With reference once again to FIG. 1, a charge pump (CP) circuit 20 generates an output current Icp(t) in response to the durations (i.e., widths) of the pulses of the up signal U(t) and the down signal D(t). The CP circuit 20 includes a current source (path) circuit (not explicitly shown, see FIG. 4) that operates in response to the up signal U(t) to provide a sourcing current contribution to the charge pump output current Icp(t). The CP circuit 20 further includes a current sink (path) circuit (not explicitly shown, see FIG. 4) that operates in response to the down signal D(t) to provide a sinking current contribution to the charge pump output current Icp(t). The output current Icp(t) is the difference between the sourcing current contribution and the sinking current contribution. When the up and down signals have identical pulses, as in case a) noted above, the output current Icp(t) is zero because the sourcing current contribution and the sinking current contribution due the pulses of the up signal U(t) and the down signal D(t) are offset. In the case where the up signal U(t) pulse duration is longer than the down signal D(t) pulse duration, as in case b) noted above, the output current Icp(t) comprises a momentary sourcing of current for a duration of the difference in the widths of the pulses of the up signal U(t) and the down signal D(t). Conversely, in the case where the down signal D(t) pulse duration is longer than the up signal U(t) pulse duration, as in the case c) noted above, the output current Icp(t) comprises a momentary sinking of current for a duration of the difference in the widths of the pulses of the up signal U(t) and the down signal D(t).

A loop filter (LF) circuit 22 filters the output current Icp(t) from the charge pump circuit 20 to generate a control voltage Vctrl(t). In an embodiment, the LF circuit 22 is implemented as an analog integration circuit, and so the control voltage Vctrl(t) is generated by integrating the sourcing and sinking currents. Thus, the control voltage Vctrl(t) will incrementally increase in response to each momentary increase in the output current Icp(t) and incrementally decrease in response to each momentary decrease in the output current Icp(t).

A voltage controlled oscillator (VCO) circuit 30 generates an oscillating output signal Vout(t) having a frequency that is controlled by the level of the control voltage Vctrl(t). An increase in the control voltage Vctrl(t) level due to a momentary increase in the output current Icp(t) causes a corresponding increase in the frequency of the oscillating output signal Vout(t). Conversely, a decrease in the control voltage Vctrl(t) level due to a momentary decrease in the output current Icp(t) causes a corresponding decrease in the frequency of the oscillating output signal Vout(t).

A programmable divider circuit 34 frequency divides the oscillating output signal Vout(t) to generate the feedback clock signal CLKfb(t). The programmable divider circuit 34 implements a fractional division ratio between the frequency of the oscillating output signal Vout(t) and the frequency of the feedback clock signal CLKfb(t). That fractional division ratio is equal to N+y[n], where y[n] is an integer that is represented by one or more bits. The programmable divider circuit 34 operates to divide the oscillating output signal Vout(t) by N+y[n] in each period of time. For example, in the case where y[n] is a single bit, the programmable divider circuit 34 operates to divide the oscillating output signal Vout(t) by N+1 (for each logic 1 integer value for the single bit) and divide the oscillating output signal Vout(t) by N (for each logic 0 integer value for the single bit).

The integer values for y[n] for the digital signal 38 may, for example, be generated by a fractional Delta-Sigma modulator (DSM) circuit 44. The fractional Delta-Sigma modulator (DSM) circuit 44 receives the feedback clock signal CLKfb(t) and a control signal a specifying a fractional value between 0 and 1. In response to this input, the DSM circuit 44 generates the integers for y[n] and controls the lengths of each period of time in the sequence. The programmable divider circuit 34 responds to the integers by performing the division by N+y[n] in each period of time. In this case, the avg(y[n])=α, where "avg" is the average function. As a result, the frequency $f_{PLL}$ of the oscillating output signal Vout(t) on average will equal $(N+\alpha)*f_{CLK}$, where $f_{CLK}$ is the frequency of the reference clock signal CLKref(t).

A concern with the PLL circuit 10 of FIG. 1 is that quantization noise from the DSM circuit 44 is injected into the programmable divider circuit 34 and passes through the PFD circuit 12 and the CP circuit 20 before being integrated by the LF circuit 22. A conventional solution to this noise problem is to reduce the bandwidth (BW) of the PLL circuit 10 and thus filter out the noise. This is an acceptable tradeoff for PLL circuit designers in certain circuit applications. However, in situations where a high bandwidth for the PLL circuit is needed, noise cancelation techniques must instead be used.

There is accordingly a need in the art for improved noise cancelation techniques.

SUMMARY

A phase lock loop (PLL) circuit includes a fractional-N divider generating a feedback clock signal. A noise cancelation circuit for the PLL circuit comprises: a synchronization circuit that receives a voltage controlled clock signal of the PLL circuit and the feedback clock signal and is configured to generate a first synchronized feedback clock signal and a second synchronized feedback clock signal, wherein the second synchronized feedback clock signal is delayed by an integer number of cycles of the voltage controlled clock signal; a first phase-frequency detector circuit that receives the first synchronized feedback clock signal and the second synchronized feedback clock signal and is configured to generate a first up control signal and a first down control signal, wherein a pulse width of the first up control signal differs from a pulse width of the first down control signal by said integer number of cycles; a logic circuit that is configured to generate an up digital control signal and a down digital control signal in response to the first up control signal, the first down control signal and a digital code signal indicative of a magnitude of a noise canceling correction; and a current digital to analog converter circuit that receives the up digital control signal and the down digital control signal and comprises: a current sourcing circuit operating in response to the up digital control signal to provide a noise canceling sourcing current to the PLL circuit; and a current sinking circuit operating in response to the down digital control signal to provide a noise canceling sinking current to the PLL circuit.

A phase lock loop (PLL) circuit includes a fractional-N divider generating a feedback clock signal, a first phase frequency detector configured to compare the feedback clock signal to a reference clock signal and generate a first up control signal and a first down control signal, and a charge pump circuit controlled by the first up control signal and the first down control signal to generate a charge pump output current. A noise cancelation circuit for the PLL circuit comprises: a synchronization circuit that receives a voltage controlled clock signal of the PLL circuit and the feedback clock signal and is configured to generate a first synchronized feedback clock signal and a second synchronized feedback clock signal, wherein the second synchronized feedback clock signal is delayed by an integer number of cycles of the voltage controlled clock signal; a second phase-frequency detector circuit that receives the first synchronized feedback clock signal and the second synchronized feedback clock signal and is configured to generate a second up control signal and a second down control signal, wherein a pulse width of the second up control signal differs from a pulse width of the second down control signal by said integer number of cycles; and a current digital to analog converter circuit controlled in response to the second up control signal to apply a noise canceling sourcing current to the charge pump output current and controlled in response to the second down control signal to apply a noise canceling sinking current to the charge pump output current.

In an embodiment, a method is presented for noise cancelation circuit in a phase lock loop (PLL) circuit that includes a fractional-N divider receiving a voltage controlled clock signal of the PLL circuit and generating a feedback clock signal of the PLL circuit. The method comprises: generating from the voltage controlled clock signal of the PLL circuit and the feedback clock signal a first synchronized feedback clock signal and a second synchronized feedback clock signal that is delayed from the first synchronized feedback clock signal by an integer number of cycles of the voltage controlled clock signal; processing the first and second synchronized feedback clock signals to generate a first up control signal and a first down control signal, wherein a pulse width of the first up control signal differs from a pulse width of the first down control signal by said integer number of cycles; generating a digital code signal indicative of a magnitude of a noise canceling correction; applying a noise canceling sourcing current to the PLL circuit, wherein a magnitude of said noise canceling sourcing current is dependent on the digital code signal and an up digital control signal derived from the first up control signal and the first down control signal; and applying a noise canceling sinking current to the PLL circuit, wherein a magnitude of said noise canceling sinking current is dependent on the digital code signal and a down digital control signal derived from the first up control signal and the first down control signal.

In an embodiment, the method comprises: synchronizing the feedback clock signal to the voltage controlled clock signal to generate a first synchronized feedback clock signal and a second synchronized feedback clock signal delayed from the first synchronized feedback clock signal by an integer number of cycles of the voltage controlled clock signal; phase comparing the first and second synchronized feedback clock signal to generate an up control signal and a down control signal, wherein a pulse width of the up control signal differs from a pulse width of the down control signal by said integer number of cycles; and applying a noise canceling sourcing current to the PLL circuit in response to the up control signal; and applying a noise canceling sinking current to the PLL circuit in response to the down control signal.

BRIEF DESCRIPTION OF THE DRAWINGS

For a better understanding of the embodiments, reference will now be made by way of example only to the accompanying figures in which.

DETAILED DESCRIPTION

Figure 1:
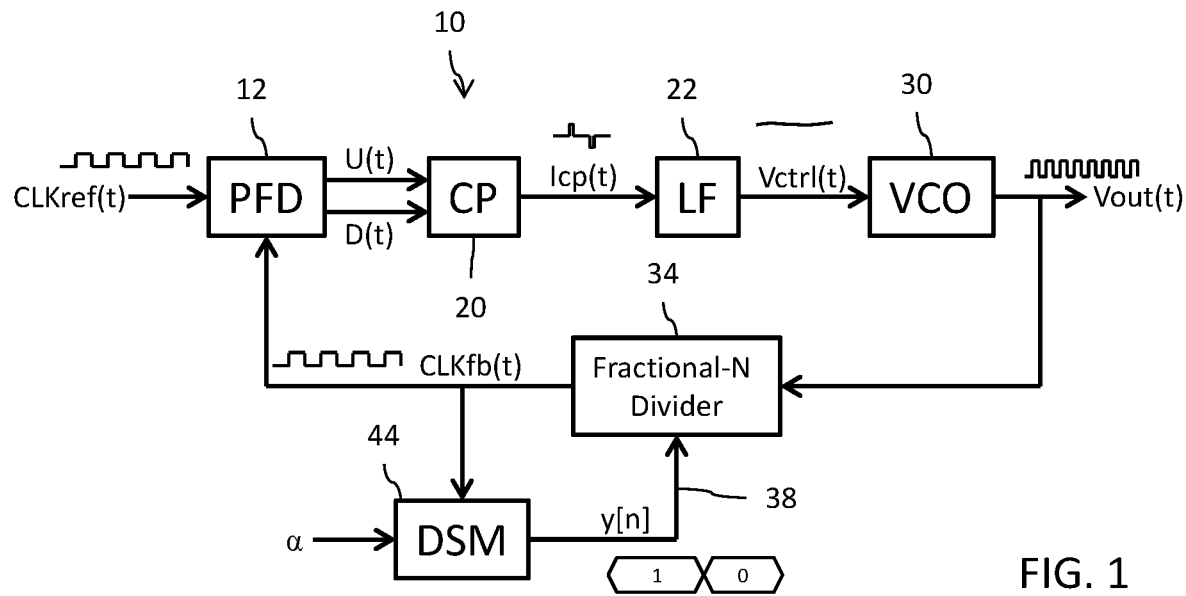
FIG. 1 is a block diagram of a fractional-N phase lock loop (PLL) circuit.
Figure 3:
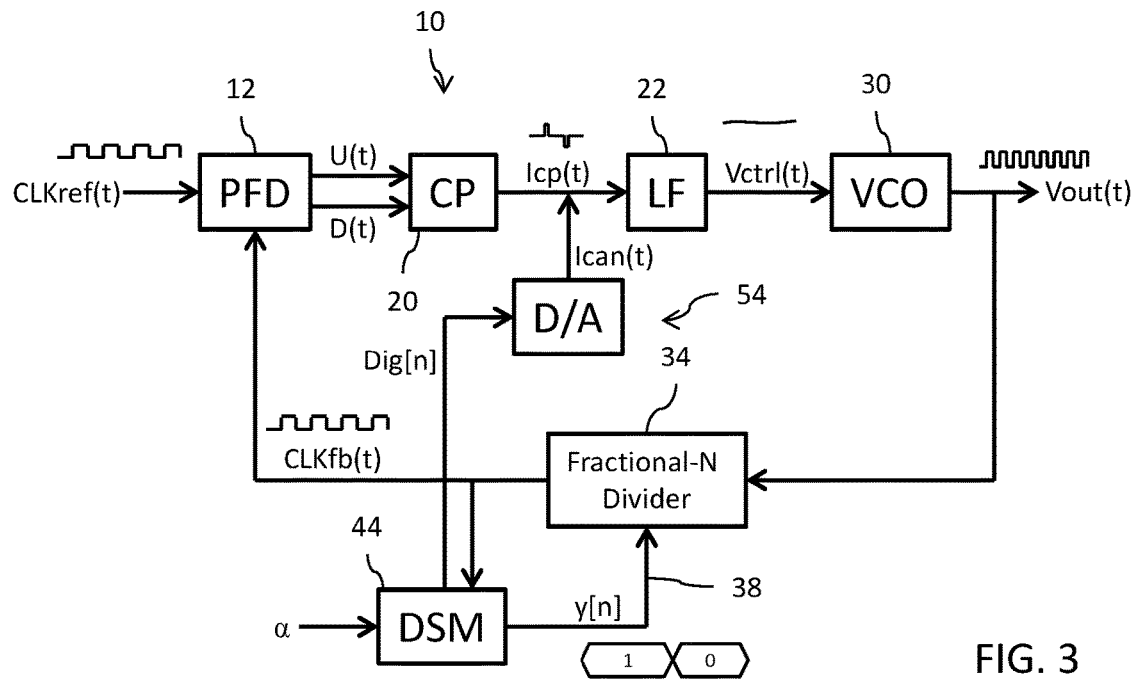
FIG. 3 is a block diagram of a fractional-N PLL circuit that implements a quantization noise cancelation technique.

FIG. 3 shows a block diagram of a fractional-N phase lock loop (PLL) circuit 50 that implements a quantization noise cancelation technique. Like reference numbers in FIGS. 1 and 3 refer to same or similar components, circuits, parts, signals, etc., and a repeated discussion thereof is omitted here for the sake of brevity. See, discussion above. The PLL circuit 50 differs from the PLL circuit 10 in the addition of a quantization noise cancelation circuit 54. The quantization noise cancelation circuit 54 comprises a digital-to-analog (D/A) converter circuit having an input receiving a digital code signal Dig[n] output by the DSM circuit 44. This digital code signal Dig[n] is converted by the D/A converter circuit to generate an analog noise cancelation current Ican(t) that is applied to the output current Icp(t) from the charge pump circuit 20. In effect, this noise cancelation current Ican(t) corresponds to the SDM quantization noise and is subtracted from the output current Icp(t). The noise cancelation current Ican(t) is thus a variable current that is applied at any one instance as either a sourcing current or a sinking current for a fixed duration that will cancel the charge equivalent of the quantization noise that is present in the output current Icp(t). In this implementation, it will be recognized that the accuracy of the noise cancelation is highly dependent on the implementation of the D/A converter circuit.

The charge noise in the output current Icp(t) generated by the charge pump circuit 20 due to the quantization noise produced by the DSM circuit 44 is given by:

$$Q[n]=Icp*Tvco\Sigma_0^{n-1}(y[k]-\alpha)$$

where: Icp is the charge pump current; and Tvco is the period of the oscillating output signal Vout(t). The reason that Q[n] is dependent on the period of the oscillating output signal Vout(t) (or some function thereof) is because the divider 34 will, based on the value of y[n], add or subtract that many clock cycles of the input from its output (i.e., the feedback clock signal CLKfb(t)).

To cancel this noise, the D/A converter circuit generates the noise cancelation current Ican(t). The idea here is to cancel the noise in the shortest possible period of time. Since the smallest and most accurate time available in the PLL system corresponds to Tvco, this period is used to generate the ON time for noise cancelation. Because of time lag concerns, direct use of Tvco may not be possible, and thus integer multiples of Tvco are instead used for the noise cancelation current Ican(t). As a result, the DC and transient switching behavior of the D/A converter circuit must be closely matched to the DC and transient switching behavior of the CP circuit 20. This is difficult because there exist a number of sources of mismatch that contribute to differences in transient behavior: the SDM quantization noise passes through both the PFD circuit and the CP circuit, while the cancelation charge passes through only the D/A converter circuit; the current source and sink paths of the CP circuit are turned ON for different widths in response to a phase error, and the turning on of both the current source path and the current sink path effectively cancels the charge injection for VCO control due to switching; and the noise cancelation current Ican(t) from the D/A converter circuit is typically applied to only one of the source and sink current paths. Due to these mismatches, the overall effect of the noise cancelation is limited, and there can result in an increase in PLL clock jitter.

To reduce the impact of switching in the D/A converter circuit, the ON time for the application of the cancelation current Ican(t) can be increased. It is also helpful to implement path matching through logic circuitry in order to ensure that the D/A converter circuit turns on for exactly the desired fixed duration of time when applying the cancelation current Ican(t) that cancels the quantization noise. Because this cancelation technique involves a cancelation of charge, in order to maintain the same resolution in the D/A converter circuit, there is a requirement to decrease the current associated with the least significant bit (LSB) in the event that there is an increase in the current ON time. This acts as a constraint on the design of the D/A converter circuit for low current support. Furthermore, in order to address and reduce jitter, the cancelation current Ican(t) for providing noise cancelation should be injected in the same duration as the fractional (quantization) noise is injected through the CP circuit 20 into the LF circuit. Increasing the current ON time, however, will increase the amount of time for the injection which in turn increases the jitter. Delay matching in the quantization noise cancelation circuit 54 is also a challenge since it is not robust across process, voltage and temperature (PVT) variation.

Figure 4:
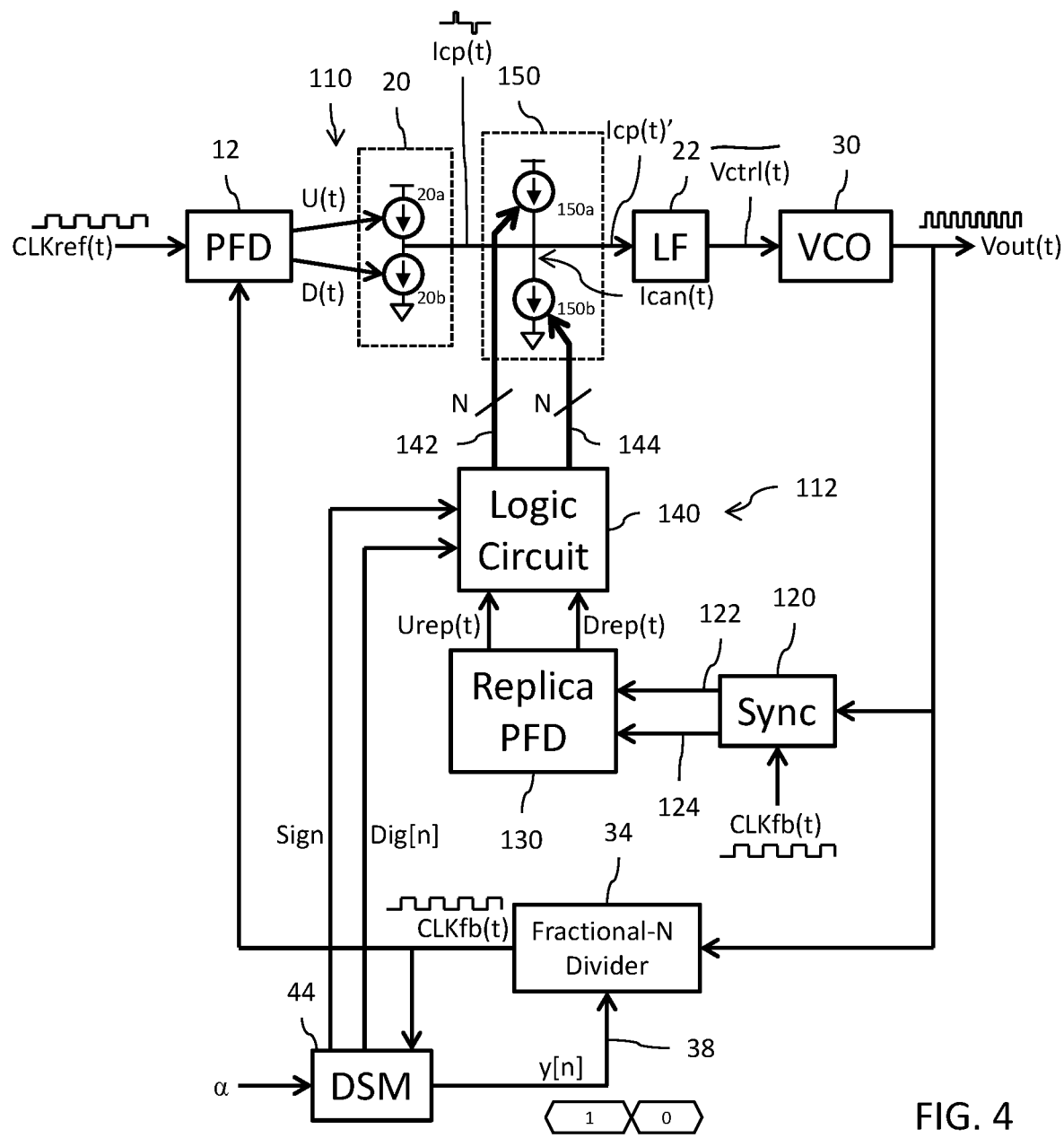
FIG. 4 is a block diagram of a fractional-N PLL circuit that implements another quantization noise cancelation technique.

Reference is now made to FIG. 4 which shows a block diagram of a fractional-N phase lock loop (PLL) circuit 110 that implements another quantization noise cancelation technique. The PLL circuit 110 differs from the PLL circuits 10 and 50 in the use of a quantization noise cancelation circuit 112. Like reference numbers in FIGS. 1, 3 and 4 refer to same or similar components, circuits, parts, signals, etc., and a repeated discussion thereof is omitted here for the sake of brevity. See, discussion above.

The quantization noise cancelation circuit 112 includes a synchronization (SYNC) circuit 120 having a first input that receives the feedback clock signal CLKfb(t) and a second input that receives the oscillating output signal Vout(t), or some derivative thereof, from the VCO circuit 30. The SYNC circuit 120 generates a synchronized feedback signal (CLKfb_sync) 122 which is equal to the feedback clock signal CLKfb(t) having edges synchronized to like edges of the oscillating output signal Vout(t). The SYNC circuit 120 further generates a delayed synchronized feedback signal (CLKfb_sync_dly) 124 which is equal to the synchronized feedback signal CLKfb_sync delayed by a desired number of clock cycles of the oscillating output signal Vout(t). In this specific example shown, the delay is one clock cycle.

Figure 5:
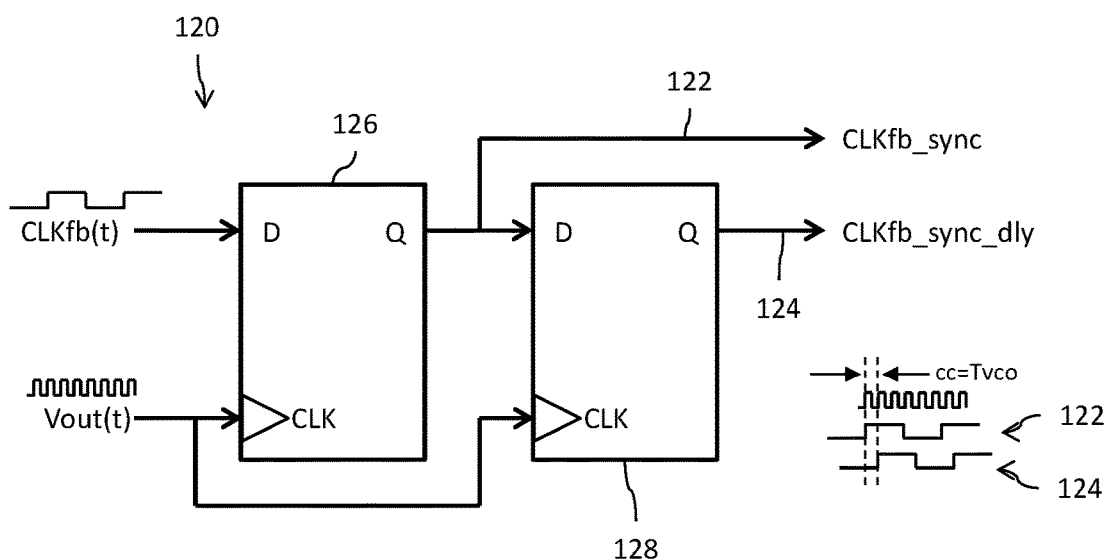
FIG. 5 is a block diagram of a SYNC circuit used in the PLL circuit of FIG. 4.

FIG. 5 shows a block diagram of an embodiment of the SYNC circuit 120. The SYNC circuit 120 includes a first D-type flip flop (FF) circuit 126 having a data (D) input that receives the feedback clock signal CLKfb(t) and a clock (CLK) input that receives the oscillating output signal Vout(t). The output (Q) of the FF circuit 126 generates the synchronized feedback signal CLKfb_sync which is applied to the data (D) input of a second D-type flip flop (FF) circuit 128. The clock (CLK) input of the FF circuit 128 receives the oscillating output signal Vout(t). The output (Q) of the FF circuit 128 generates the delayed synchronized feedback signal (CLKfb_sync_dly) 124.

It will be noted that the circuit of FIG. 5 is implemented to have the delayed synchronized feedback signal (CLKfb_sync_dly) 124 be delayed by one clock cycle of oscillating output signal Vout(t) relative to the synchronized feedback signal CLKtb_sync. This is by example only. In a situation where the ON time of the cancelation current Ican(t) needs to be increased, the circuit of FIG. 5 can be implemented with additional FF circuits 128 in series as needed to provide the required integer multiple of Tvco for the noise cancelation current Ican(t).

Figure 2:
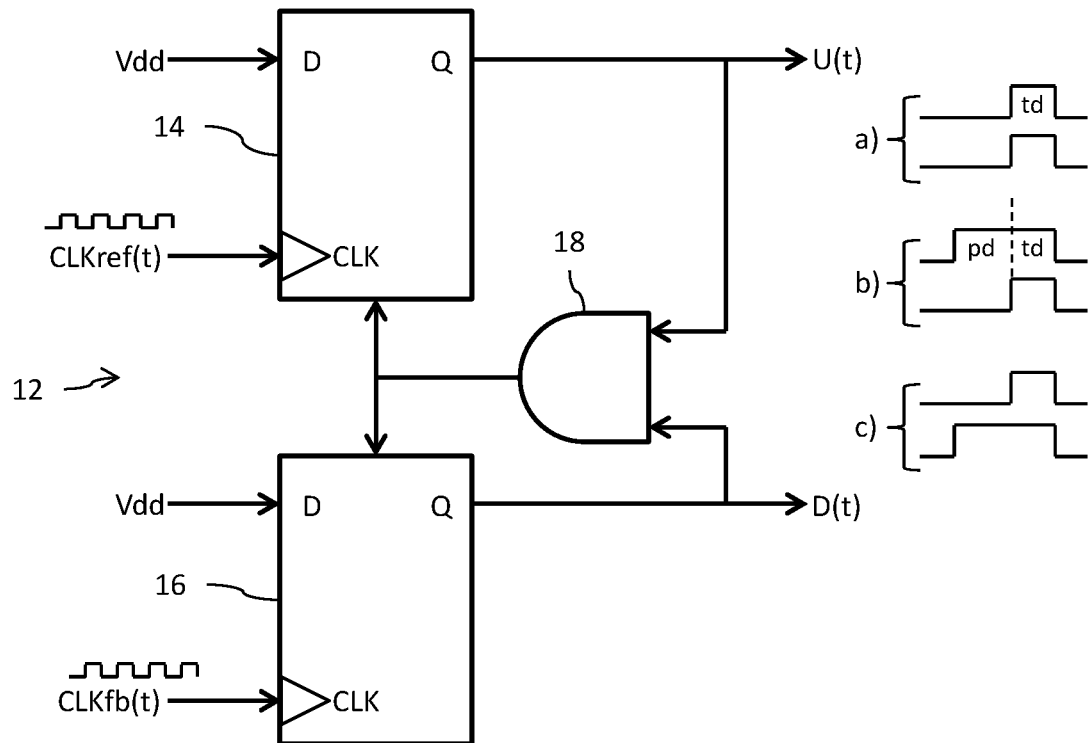
FIG. 2 is a block diagram of a PFD circuit used in the PLL circuit of FIG. 1.

With reference once again to FIG. 4, the quantization noise cancelation circuit 112 further includes a circuit replica phase-frequency detector (PFD) circuit 130. By "circuit replica" what is meant is that the circuitry used for the PFD circuit 130 is a copy of the circuitry used for the PFD circuit 12 (compare, FIGS. 2 and 6 and the use of an identical circuit architecture).

Figure 6:
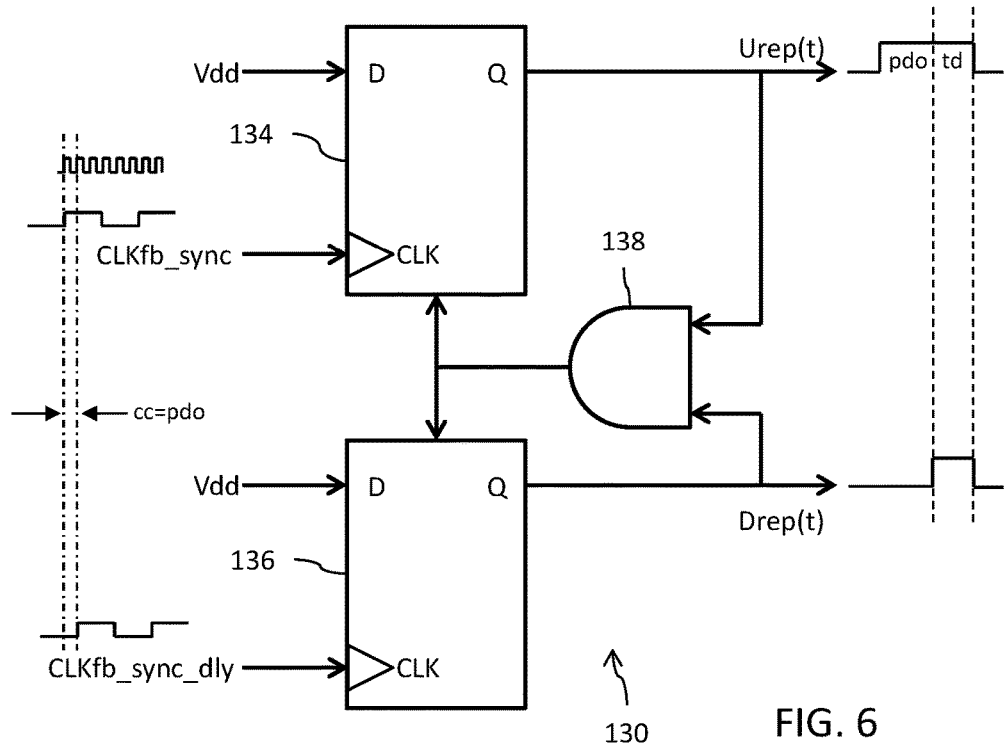
FIG. 6 is a block diagram of a replica PFD circuit used in the PLL circuit of FIG. 4.

With reference now also to FIG. 6, the replica PFD circuit 130 has a first input that receives the synchronized feedback signal (CLKfb_sync) 122 and a second input that receives the delayed synchronized feedback signal (CLKfb_sync_dly) 124. The synchronized feedback signal (CLKfb_sync) 122 is applied to the clock (CLK) input of a first D-type flip flop (FF) circuit 134 that also has a data (D) input that receives a logic high voltage (Vdd). The output (Q) of the FF circuit 134 generates an up signal Urep(t). The delayed synchronized feedback signal (CLKfb_sync_dly) 124 is applied to the clock (CLK) input of a second D-type flip flop (FF) circuit 136 that also has a data (D) input that receives the logic high voltage (Vdd). The output (Q) of the FF circuit 136 generates a down signal Drep(t). A logic AND gate 138 has a first input that receives the up signal Urep(t) and a second input that receives the down signal Drep(t). The gate 138 logically ANDs those signals to generate a reset signal that is applied to the reset inputs (RST) of the first and second FF circuits 134 and 136.

Due to the configuration of the sync circuit 120, the synchronized feedback signal (CLKfb_sync) 122 and the delayed synchronized feedback signal (CLKfb_sync_dly) 124 will always have a phase relationship where the edge of the synchronized feedback signal (CLKfb_sync) 122 leads the like edge of the delayed synchronized feedback signal (CLKfb_sync_dly) 124; more specifically, leads by one period Tvco of the oscillating output signal Vout(t) (or an integer multiple set by the number of FF circuits 128 as noted above). Because of this, the up signal Urep(t) is pulsed for a first duration of time and the down signal Drep(t) is pulsed for a second duration of time (less than the first duration). The smaller pulse width for the down signal Drep(t) is controlled by the time delay (td) for operation of the AND gate 138 to cause the first and second FF circuits 134 and 136 to reset. The longer pulse width for the up signal Urep(t) is controlled as a function of the sum of the minimum pulse width (td) plus the difference in time (i.e., the phase difference—pdo) between the like edges of the synchronized feedback signal (CLKfb_sync) 122 and the delayed synchronized feedback signal (CLKfb_sync_dly) 124. This phase difference (pdo) is dependent on the delay imposed by the (one or more second flip flops 128 of the) sync circuit 120 which is equal to one (or more) clock cycle(s) (cc) (i.e., one or more periods Tvco) of the oscillating output signal Vout(t).

Referring once again to FIG. 4, the CP circuit 20 includes a current source (path) circuit 20a that operates in response to assertion of the up signal U(t) to provide a sourcing current contribution to the charge pump output current Icp(t). The CP circuit 20 further includes a current sink (path) circuit 20b that operates in response to assertion of the down signal D(t) to provide a sinking current contribution to the charge pump output current Icp(t). The output current Icp(t) is the difference between the sourcing current contribution and the sinking current contribution. As previously noted, this charge pump output current Icp(t) is perturbed by the SDM quantization noise. The quantization noise cancelation circuit 112 functions to cancel the SDM quantization noise to generate a corrected (or compensated) output current Icp(t)', substantially free of the SDM quantization noise, for application to the input of the LF circuit 22.

The quantization noise cancelation circuit 112 includes a current digital-to-analog (D/A) converter circuit 150 configured to generate a noise cancelation current Ican(t) that is applied to cancel the quantization noise present in the output current Icp(t) of the CP circuit 20. The current D/A converter circuit 150 includes a current source (path) circuit 150a that operates in response to an N-bit signal (UP_DAC<N−1:0>) 142 to provide a controllable magnitude sourcing current contribution to the noise cancelation current Ican(t). The current source (path) circuit 150a may, for example, be implemented by N individual current sources that are actuated by corresponding bits of the N-bit signal (UP_DAC<N−1:0>) 142. Each current source in the current source (path) circuit 150a may generate a same magnitude current in response to assertion of the bit. The current D/A converter circuit 150 further includes a current sink (path) circuit 150b that operates in response to an N-bit signal (DN_DAC<N−1:0>) 144 to provide a controllable magnitude sinking current contribution to the noise cancelation current Ican(t). The current sink (path) circuit 150b may, for example, be implemented by N individual current sinks that are actuated by corresponding bits of the N-bit signal (DN_DAC<N−1:0>) 142. Each current sink in the current sink (path) circuit 150b may generate a same magnitude current in response to assertion of the bit.

The quantization noise cancelation circuit 112 further includes a logic circuit 140 configured to generate the N-bit signal (UP_DAC<N−1:0>) 142 that is input to the current digital-to-analog (D/A) converter circuit 150 for controlling operation of the (individual current sources of the) current source (path) circuit 150a. The logic circuit 140 is further configured to generate the N-bit signal (DN_DAC<N−1:0>) 144 that is input to the current digital-to-analog (D/A) converter circuit 150 for controlling operation of the (individual current sinks of the) current sink (path) circuit 150b. The N-bit signal (UP_DAC<N−1:0>) 142 and N-bit signal (DN_DAC<N−1:0>) 144 are generated in response to the up signal Urep(t) and down signal Drep(t) output by the replica PFD circuit 130, and the digital code signal Dig[n] with sign bit (Sign) output by the DSM circuit 44. In this context, in response to $\Sigma_0^{n-1}(y[k]-\alpha)$ the digital code signal Dig[n] provides information on magnitude of the noise cancelation current and the sign bit provides information on polarity (i.e., perform a sourcing of current or perform a sinking of current).

Figure 7:
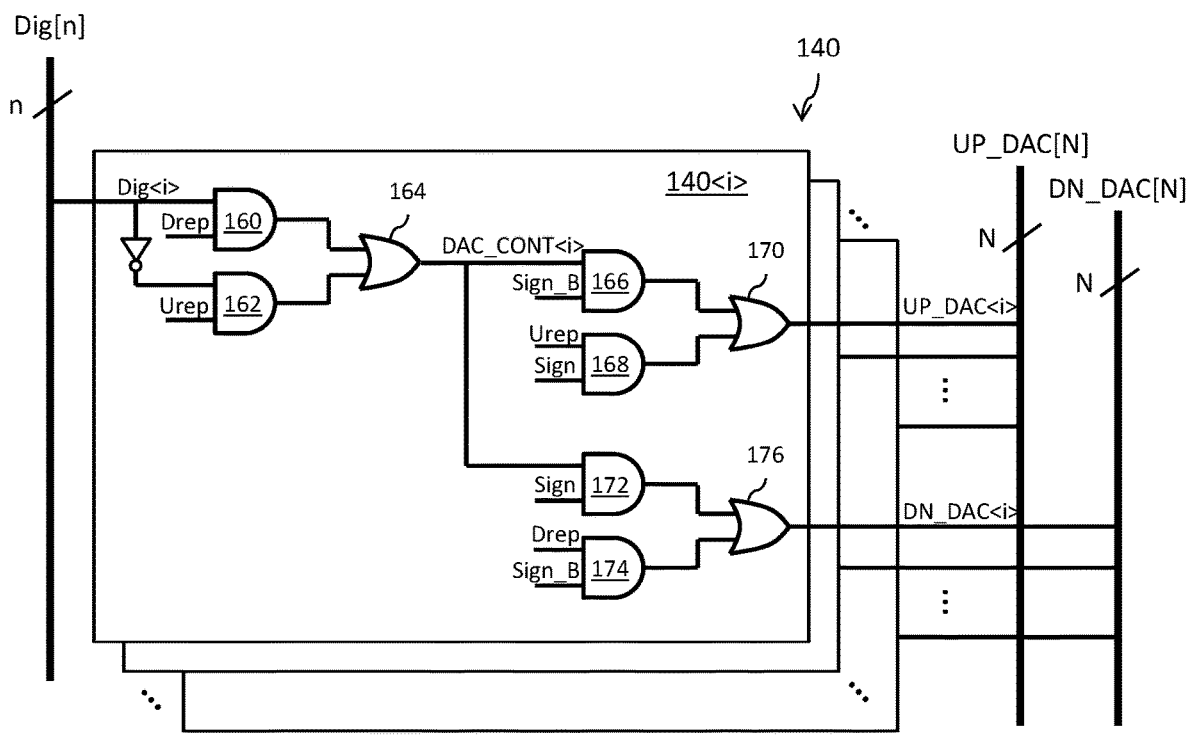
FIG. 7 is a block diagram of a logic circuit.
Figure 8A:
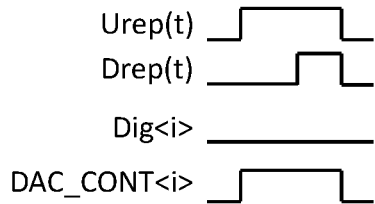
FIGS. 8A-8B, 9A-9D and 10A-10D are timing diagrams illustrating operation of the logic circuit of FIG. 7.
Figure 8B:
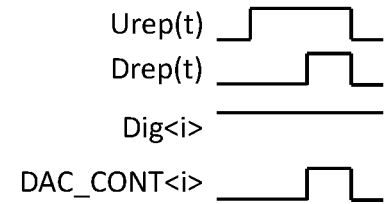

Reference is now made to FIG. 7 which shows a block diagram of the logic circuit 140. The logic circuit 140 includes n=N subcircuits 140<i>, with each subcircuit operating to convert one bit of the digital code signal Dig[n] to a corresponding bit of the UP_DAC signal 142 and a corresponding bit of the DN_DAC signal 144. The logic within each subcircuit is identical. A first logical AND gate 160 has a first input that receives the i-th bit of the digital code signal Dig[n] and a second input that receives the down signal Drep(t) output by the replica PFD circuit 130. A second logical AND gate 162 has a first input that receives logically inverted i-th bit of the digital code signal Dig[n] and a second input that receives the up signal Urep(t) output by the replica PFD circuit 130. The signals output by the AND gates 160 and 162 are processed by a logical OR gate 164 to generate the i-th bit of a DAC_CONT<i> signal. This logic provided by gates 160, 162 and 164 generates the DAC_CONT<i> signal to have a pulse equal to the pulse of the up signal Urep(t) when the logic of the i-th bit of the digital code signal Dig<i> is logic low (FIG. 8A); i.e., when the bit of the digital code signal Dig is not asserted. Conversely, the DAC_CONT<i> signal will have a pulse equal to the pulse of the down signal Drep(t) when the logic of the i-th bit of the digital code signal Dig<i> is logic high (FIG. 8B); i.e., when the bit of the digital code signal Dig is asserted.

Figure 9A:
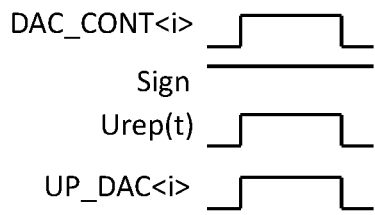
Figure 9B:
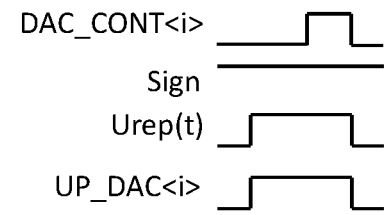
Figure 9C:
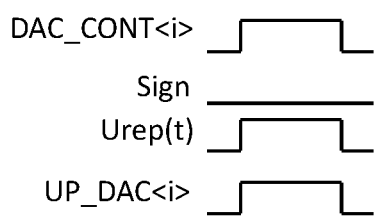
Figure 9D:
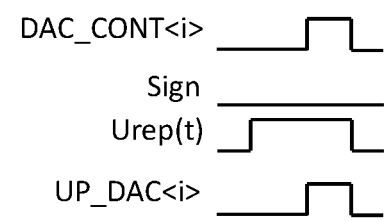

A third logical AND gate 166 has a first input that receives the i-th bit of the DAC_CONT<i> signal and a second input that receives the logically inverted Sign bit. A fourth logical AND gate 168 has a first input that receives the up signal Urep(t) output by the replica PFD circuit 130 and a second input that receives the Sign bit. The signals output by the AND gates 166 and 168 are processed by a logical OR gate 170 to generate the i-th bit of the UP_DAC signal 142. This logic provided by gates 166, 168 and 170 generates the UP_DAC<i> signal 142 to have a pulse equal to the pulse of the up signal Urep(t) when the i-th bit of the digital code signal Dig<i> is logic low (i.e., deasserted) (see, FIGS. 9A and 9C), regardless of the logic state of the sign bit. Conversely, when the i-th bit of the digital code signal Dig<i> is logic high (i.e., asserted), the logic provided by gates 166, 168 and 170 generates the UP_DAC<i> signal 142 to have a pulse equal to the pulse of the up signal Urep(t) when the sign bit is asserted (logic 1) as shown in FIG. 9B or to have a pulse equal to the pulse of the down signal Drep(t) when the sign bit is deasserted (logic 0) as shown in FIG. 9D.

Figure 10A:
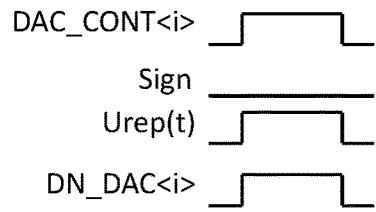
Figure 10B:
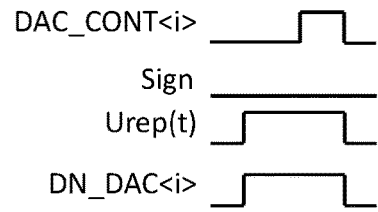
Figure 10C:
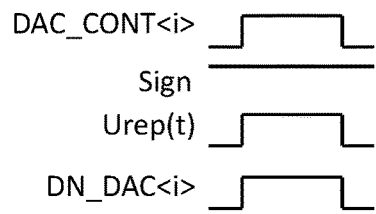
Figure 10D:
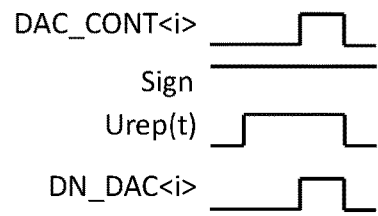

A fifth logical AND gate 172 has a first input that receives the i-th bit of the DAC_CONT<i> signal and a second input that receives the Sign bit. A sixth logical AND gate 174 has a first input that receives the up signal Urep(t) output by the replica PFD circuit 130 and a second input that receives the logically inverted Sign bit. The signals output by the AND gates 172 and 174 are processed by a logical OR gate 176 to generate the i-th bit of the DN_DAC signal 144. This logic provided by gates 172, 174 and 176 generates the DN_DAC<i> signal 144 to have a pulse equal to the pulse of the up signal Urep(t) when the i-th bit of the digital code signal Dig<i> is logic low (i.e., deasserted) (see, FIGS. 10A and 10C), regardless of the logic state of the sign bit. Conversely, when the i-th bit of the digital code signal Dig<i> is logic high (i.e., asserted), the logic provided by gates 172, 174 and 176 generates the DN_DAC<i> signal 144 to have a pulse equal to the pulse of the up signal Urep(t) when the sign bit is deasserted (logic 0) as shown in FIG. 10B or to have a pulse equal to the pulse of the down signal Drep(t) when the sign bit is asserted (logic 1) as shown in FIG. 10D.

Figure 11A:
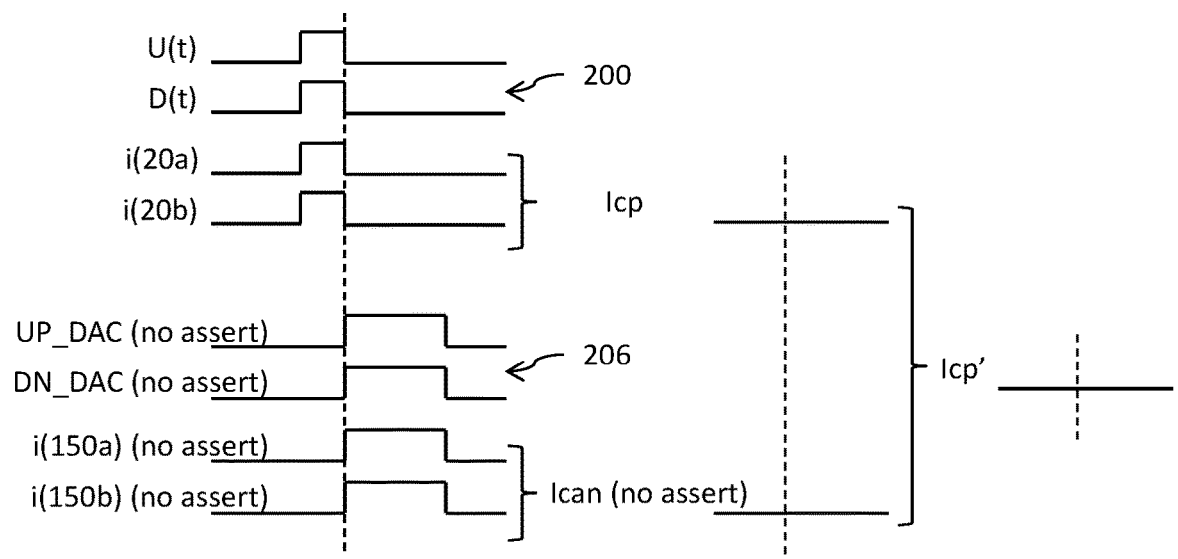
FIGS. 11A-11C are timing diagrams illustrating operation of the charge pump and current digital-to-analog (D/C) converter circuits used in the PLL circuit of FIG. 4.

Reference is now made to FIG. 11A which shows a timing diagram for operation of the CP circuit 20 and current D/A converter circuit 150 in the case a) where like edges of the reference clock signal CLKref(t) and the feedback clock signal CLKfb(t) are aligned. As noted above, the PFD circuit 12 in this case will generate the up signal U(t) and down signal D(t) to have identical pulses (reference 200) with a width (smaller) controlled by the time delay (td) for operation of the AND gate 18 to cause the first and second FF circuits 14 and 16 to reset. As a result, the sourcing current i(20a) and the sinking current i(20b) will be identical and the output current Icp(t) is zero due to the offsetting of the source current contribution and the sink current contribution.

The noise to be canceled through the D/A converter circuit 150 comes in the form of the difference in pulse widths for the up signal U(t) and down signal D(t) due to the phase difference between the up signal U(t) and the down signal D(t). In this case a), due to the alignment of the reference clock signal CLKref(t) and the feedback clock signal CLKfb(t), the up signal U(t) and down signal D(t) will have identical widths (reference 200). The digital code signal Dig[n] generated by the DSM circuit 44 in this case will have no asserted bits, referred to in FIG. 11A as "no assert", and the value of the sign bit is of no consequence. In this regard, it will be noted that the DSM circuit 44 outputs the digital code signal Dig[n] proportional to $\Sigma_0^{n-1}(y[k]-\alpha)$, and when this equals 0 then the code is also 0 and none of the bits of the code are asserted. Control is exercised over the current D/A converter circuit 150 through the logic circuit 140 so that all of the (individual current sources of the) current source (path) circuit 150a and all of the (individual current sinks of the) current sink (path) circuit 150b are actuated in response to the no assertion of any bits of the code for an identical pulse width (reference 206) equal to the sum of the minimum pulse width (td) plus the phase difference (pdo) provided by the up signal Urep(t) output by the replica PFD circuit 130 (see, FIGS. 8A, 9A, 9C, 10A and 10C). As a result, the sourcing current i(150a) and the sinking current i(150b) for the actuated current sources and sinks, respectively, will be identical and the output current Ican(t) is zero due to the offsetting of the source current contribution and the sink current contribution.

Figure 11B:
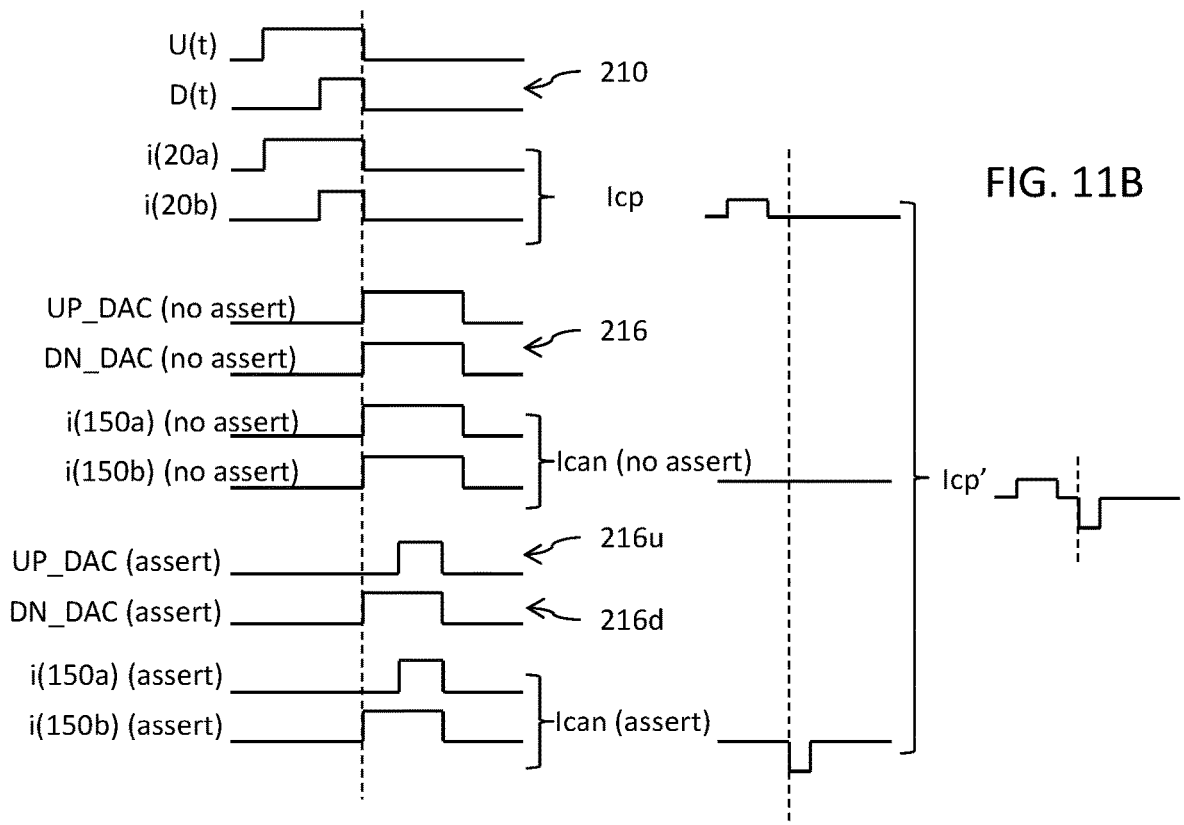

Reference is now made to FIG. 11B which shows a timing diagram for operation of the CP circuit 20 and current D/A converter circuit 150 in the case b) where the edge of the reference clock signal CLKref(t) leads the like edge of the feedback clock signal CLKfb(t). As noted above, the PFD circuit 12 in this case will generate, as shown at reference 210, the down signal D(t) to have a width (smaller) controlled by the time delay (td) for operation of the AND gate 18 to cause the first and second FF circuits 14 and 16 to reset and generate the up signal U(t) to have a width (longer) controlled as a function of the sum of the minimum pulse width (td) plus the difference in time (i.e., the phase difference—pd) between the like edges of the reference clock signal CLKref(t) and the feedback clock signal CLKfb(t). As a result, the sourcing current i(20a) and the sinking current i(20b) will not be identical and the output current Icp(t) includes a sourcing current contribution (i.e., a current sourcing pulse).

The noise to be canceled through the D/A converter circuit 150 comes in the form of the difference in pulse widths for the up signal U(t) and down signal D(t) due to the phase difference between the up signal U(t) and the down signal D(t). In this case b), where the edge of the reference clock signal CLKref(t) leads the like edge of the feedback clock signal CLKfb(t), the up signal U(t) has a longer width than the down signal D(t). The compensation operation in this case is to actuate more sinking current i(150b) than sourcing current i(150a) and thus compensate for the shorter actuation of the sinking current i(20b). The digital code signal Dig[n] generated by the DSM circuit 44 will have some number of asserted bits (the number being from 1 to N) and a sign bit indicating the compensation is a current sinking operation (i.e., the sign bit is logic 0). In this regard, it will be noted that the DSM circuit 44 outputs the digital code signal Dig[n] proportional to $\Sigma_0^{n-1}(y[k]-\alpha)$, and when this is non-zero then the code is also non-zero and at least some of the bits of the code (proportional to the non-zero value) are asserted, and the Sign bit is set corresponding to the sign of the non-zero value. The number of asserted bits in the digital code signal Dig[n] is thus dependent on the magnitude of the phase difference between the up signal U(t) and the down signal D(t). The current D/A converter circuit 150 is controlled through the logic circuit 140. For the bits of the digital code signal Dig[n] that are not asserted, referred to in FIG. 11B as "no assert", the corresponding (individual current sources of the) current source (path) circuit 150a and corresponding (individual current sinks of the) current sink (path) circuit 150b are actuated for an identical pulse width (reference 216) equal to the sum of the minimum pulse width (td) plus the phase difference (pdo) provided by the up signal Urep(t) output by the replica PFD circuit 130 (see, FIGS. 8A, 9A, 9C, 10A and 10C). As a result, the sourcing current i(150a) and the sinking current i(150b) for these current source/sink paths will be identical and the output current Ican(t) contribution from these current source/sink circuits is zero due to the offsetting of the sourcing current contribution and the sinking current contribution. On the contrary, with respect to the bits of the digital code signal Dig[n] that are asserted, referred to in FIG. 11B as "assert", the corresponding (individual current sources of the) current source (path) circuit 150a are actuated for an identical pulse width (reference 216u) equal to the minimum pulse width (td) provided by the down signal Drep(t) output by the replica PFD circuit 130 (see, FIGS. 8B and 9D), and the corresponding (individual current sinks of the) current sink (path) circuit 150b are actuated for an identical pulse width (reference 216d) equal to the sum of the minimum pulse width (td) plus the phase difference (pdo) provided by the up signal Urep(t) output by the replica PFD circuit 130 (see, FIGS. 8B and 10B). As a result, the sourcing current i(150a) and the sinking current i(150b) for these current source/sink paths will be different and the output current Ican(t) contribution from these current source/sink circuits is a sinking current pulse that compensates for the shorter actuation of the sinking current i(20b).

Figure 11C:
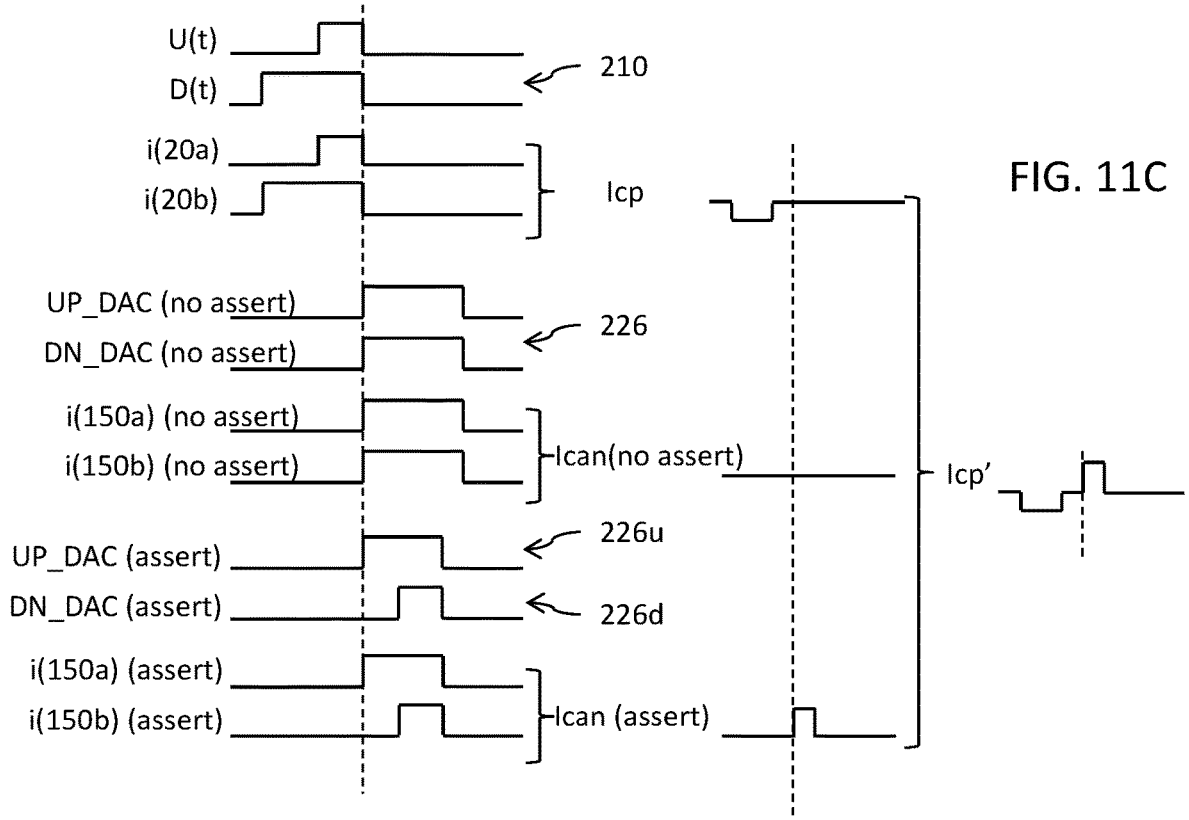

Reference is now made to FIG. 11C which shows a timing diagram for operation of the CP circuit 20 and current D/A converter circuit 150 in the case c) where the edge of the feedback clock signal CLKfb(t) leads the like edge of the reference clock signal CLKref(t). As noted above, the PFD circuit 12 in this case will generate, as shown at reference 220, the up signal U(t) to have a width (smaller) controlled by the time delay (td) for operation of the AND gate 18 to cause the first and second FF circuits 14 and 16 to reset and generate the down signal D(t) to have a width (longer) controlled as a function of the sum of the minimum pulse width (td) plus the difference in time (i.e., the phase difference—pd) between the like edges of the reference clock signal CLKref(t) and the feedback clock signal CLKfb(t). As a result, the sourcing current i(20a) and the sinking current i(20b) will not be identical and the output current Icp(t) includes a sinking current contribution (i.e., a current sinking pulse).

The noise to be canceled through the D/A converter circuit 150 comes in the form of the difference in pulse widths for the up signal U(t) and down signal D(t) due to the phase difference between the up signal U(t) and the down signal D(t). In this case c), where the edge of the feedback clock signal CLKfb(t) leads the like edge of the reference clock signal CLKref(t), the down signal D(t) has a longer width than the up signal U(t). The compensation operation in this case is to actuate more sourcing current i(150a) than sinking current i(150b) and thus compensate for the shorter actuation of the sourcing current i(20a). The digital code signal Dig[n] generated by the DSM circuit 44 will have some number of asserted bits (the number being from 1 to N) and a sign bit indicating the compensation is a current sourcing operation (i.e., the sign bit is logic 1). In this regard, it will be noted that the DSM circuit 44 outputs the digital code signal Dig[n] proportional to $\Sigma_0^{n-1}(y[k]-\alpha)$, and when this is non-zero then the code is also non-zero and at least some of the bits of the code (proportional to the non-zero value) are asserted, and the Sign bit is set corresponding to the sign of the non-zero value. The number of asserted bits in the digital code signal Dig[n] is thus dependent on the magnitude of the phase difference between the up signal U(t) and the down signal D(t). The current D/A converter circuit 150 is controlled through the logic circuit 140. For the bits of the digital code signal Dig[n] that are not asserted, referred to in FIG. 11C as "no assert", the corresponding (individual current sources of the) current source (path) circuit 150a and corresponding (individual current sinks of the) current sink (path) circuit 150b are actuated for an identical pulse width (reference 226) equal to the sum of the minimum pulse width (td) plus the phase difference (pdo) provided by the up signal Urep(t) output by the replica PFD circuit 130 (see, FIGS. 8A, 9A, 9C, 10A and 10C). As a result, the sourcing current i(150a) and the sinking current i(150b) for these current source/sink paths will be identical and the output current Ican(t) contribution from these current source/sink circuits is zero due to the offsetting of the sourcing current contribution and the sinking current contribution. On the contrary, with respect to the bits of the digital code signal Dig[n] that are asserted, referred to in FIG. 11C as "assert", the corresponding (individual current sinks of the) current sink (path) circuit 150b are actuated for an identical pulse width (reference 226d) equal to the minimum pulse width (td) provided by the down signal Drep(t) output by the replica PFD circuit 130 (see, FIGS. 8B and 10D), and the corresponding (individual current sources of the) current source (path) circuit 150a are actuated for an identical pulse width (reference 226u) equal to the sum of the minimum pulse width (td) plus the phase difference (pdo) provided by the up signal Urep(t) output by the replica PFD circuit 130 (see, FIGS. 8B and 9B). As a result, the sourcing current i(150a) and the sinking current i(150b) for these current source/sink paths will be different and the output current Ican(t) contribution from these current source/sink circuits is a sourcing current pulse that compensates for the shorter actuation of the sourcing current i(20a).

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A noise cancelation circuit for a phase lock loop (PLL) circuit including a fractional-N divider generating a feedback clock signal, comprising:
    a synchronization circuit that receives a voltage controlled clock signal of the PLL circuit and the feedback clock signal and is configured to generate a first synchronized feedback clock signal and a second synchronized feedback clock signal, wherein the second synchronized feedback clock signal is delayed by an integer number of cycles of the voltage controlled clock signal;
    a first phase-frequency detector circuit that receives the first synchronized feedback clock signal and the second synchronized feedback clock signal and is configured to generate a first up control signal and a first down control signal, wherein a pulse width of the first up control signal differs from a pulse width of the first down control signal by said integer number of cycles;
    a logic circuit that is configured to generate an up digital control signal and a down digital control signal in response to the first up control signal, the first down control signal and a digital code signal indicative of a magnitude of a noise canceling correction; and
    a current digital to analog converter circuit that receives the up digital control signal and the down digital control signal and comprises:
        a current sourcing circuit operating in response to the up digital control signal to provide a noise canceling sourcing current to the PLL circuit; and
        a current sinking circuit operating in response to the down digital control signal to provide a noise canceling sinking current to the PLL circuit.

2. The noise cancelation circuit of claim 1, wherein the fractional-N divider type PLL circuit includes a charge pump circuit generating a charge pump output current, and wherein the noise canceling sourcing current and the noise canceling sinking current are applied to cancel noise in the charge pump output current.

3. The noise cancelation circuit of claim 2, wherein the noise canceling sourcing current is added to the charge pump output current and the noise canceling sinking current is subtracted from the charge pump output current.

4. The noise cancelation circuit of claim 1, wherein the current digital to analog converter circuit further receives a sign signal indicative of a polarity of the noise canceling correction, and wherein the up digital control signal and the down digital control signal are generated in response to said sign signal.

5. The noise cancelation circuit of claim 4, wherein the fractional-N divider type PLL circuit includes a delta-sigma modulator circuit configured to control the fractional-N divider, and wherein the delta-sigma modulator circuit is configured to generate the digital code signal and the sign signal as a function of a modulation applied to control the fractional-N divider.

6. The noise cancelation circuit of claim 4, wherein the fractional-N divider type PLL circuit includes a second phase frequency detector circuit that receives a reference clock signal and the feedback clock signal and is configured to generate a second up control signal and a second down control signal for controlling a charge pump circuitry, and wherein the first phase frequency detector circuit is a circuit replica of the second phase frequency detector circuit.

7. The noise cancelation circuit of claim 1, wherein the fractional-N divider type PLL circuit includes a delta-sigma modulator circuit configured to control the fractional-N divider, and wherein the delta-sigma modulator circuit is configured to generate the digital code signal as a function of a modulation applied to control the fractional-N divider.

8. A noise cancelation circuit for a phase lock loop (PLL) circuit, wherein the PLL circuit includes a fractional-N divider generating a feedback clock signal, a first phase frequency detector configured to compare the feedback clock signal to a reference clock signal and generate a first up control signal and a first down control signal, and a charge pump circuit controlled by the first up control signal and the first down control signal to generate a charge pump output current, the noise cancelation circuit comprising:
    a synchronization circuit that receives a voltage controlled clock signal of the PLL circuit and the feedback clock signal and is configured to generate a first synchronized feedback clock signal and a second synchronized feedback clock signal, wherein the second synchronized feedback clock signal is delayed by an integer number of cycles of the voltage controlled clock signal;
    a second phase-frequency detector circuit that receives the first synchronized feedback clock signal and the second synchronized feedback clock signal and is configured to generate a second up control signal and a second down control signal, wherein a pulse width of the second up control signal differs from a pulse width of the second down control signal by said integer number of cycles; and
    a current digital to analog converter circuit controlled in response to the second up control signal to apply a noise canceling sourcing current to the charge pump output current and controlled in response to the second down control signal to apply a noise canceling sinking current to the charge pump output current.

9. The noise cancelation circuit of claim 8, wherein a noise cancelation current due to the noise canceling sourcing current and the noise canceling sinking current has a polarity opposite a polarity of the charge pump output current.

10. The noise cancelation circuit of claim 8, wherein a pulse width of a noise cancelation current due to the noise canceling sourcing current and the noise canceling sinking current is equal to said integer number of cycles of the voltage controlled clock signal.

11. The noise cancelation circuit of claim 9, further comprising a logic circuit configured to logically combine the second up control signal and the second down control signal with a digital code signal indicative of a magnitude of a noise cancelation current due to the noise canceling sourcing current and the noise canceling sinking current, and generate an up digital control signal and a down digital control signal that control, respectively, the noise canceling sourcing current and the noise canceling sinking current.

12. The noise cancelation circuit of claim 11, wherein the fractional-N divider type PLL circuit includes a delta-sigma modulator circuit configured to control the fractional-N divider, and wherein the delta-sigma modulator circuit is configured to generate the digital code signal as a function of a modulation applied to control the fractional-N divider.

13. The noise cancelation circuit of claim 9, further comprising a logic circuit configured to logically combine the second up control signal and the second down control signal with a sign signal indicative of a polarity of a noise cancelation current due to the noise canceling sourcing current and the noise canceling sinking current, and generate an up digital control signal and a down digital control signal that control the noise canceling sourcing current and the noise canceling sinking current to apply said polarity for the noise cancelation current.

14. The noise cancelation circuit of claim 13, wherein the polarity of the noise cancelation current is opposite a polarity of the charge pump output current.

15. The noise cancelation circuit of claim 13, wherein the fractional-N divider type PLL circuit includes a delta-sigma modulator circuit configured to control the fractional-N divider, and wherein the delta-sigma modulator circuit is configured to generate the sign signal as a function of a modulation applied to control the fractional-N divider.

16. The noise cancelation circuit of claim 8, wherein the second phase frequency detector circuit is a circuit replica of the first phase frequency detector circuit.

17. The noise cancelation circuit of claim 8, wherein the noise canceling sourcing current is added to the charge pump output current and the noise canceling sinking current is subtracted from the charge pump output current.

18. A method for noise cancelation circuit in a phase lock loop (PLL) circuit that includes a fractional-N divider receiving a voltage controlled clock signal of the PLL circuit and generating a feedback clock signal of the PLL circuit, comprising:
generating from the voltage controlled clock signal of the PLL circuit and the feedback clock signal a first synchronized feedback clock signal and a second synchronized feedback clock signal that is delayed from the first synchronized feedback clock signal by an integer number of cycles of the voltage controlled clock signal;
processing the first and second synchronized feedback clock signals to generate a first up control signal and a first down control signal, wherein a pulse width of the first up control signal differs from a pulse width of the first down control signal by said integer number of cycles;
generating a digital code signal indicative of a magnitude of a noise canceling correction;
applying a noise canceling sourcing current to the PLL circuit, wherein a magnitude of said noise canceling sourcing current is dependent on the digital code signal and an up digital control signal derived from the first up control signal and the first down control signal; and
applying a noise canceling sinking current to the PLL circuit, wherein a magnitude of said noise canceling sinking current is dependent on the digital code signal and a down digital control signal derived from the first up control signal and the first down control signal.

19. The method of claim 18:
wherein applying the noise canceling sourcing current to the PLL circuit comprises applying the noise canceling sourcing current to a charge pump output current; and
wherein applying the noise canceling sinking current to the PLL circuit comprises applying the noise canceling sinking current to the charge pump output current.

20. The method of claim 18, further comprising generating a sign signal indicative of a polarity of the noise canceling correction, and wherein applying the noise canceling sourcing current and applying the noise canceling sourcing current comprises controlling current application in response to the sign signal.

21. A method for noise cancelation circuit in a phase lock loop (PLL) circuit that includes a fractional-N divider receiving a voltage controlled clock signal of the PLL circuit and generating a feedback clock signal of the PLL circuit, comprising:
synchronizing the feedback clock signal to the voltage controlled clock signal to generate a first synchronized feedback clock signal and a second synchronized feedback clock signal delayed from the first synchronized feedback clock signal by an integer number of cycles of the voltage controlled clock signal;
phase comparing the first and second synchronized feedback clock signal to generate an up control signal and a down control signal, wherein a pulse width of the up control signal differs from a pulse width of the down control signal by said integer number of cycles; and
applying a noise canceling sourcing current to the PLL circuit in response to the up control signal; and
applying a noise canceling sinking current to the PLL circuit in response to the down control signal.

22. The method of claim 21:
wherein applying the noise canceling sourcing current to the PLL circuit comprises applying the noise canceling sourcing current to a charge pump output current; and
wherein applying the noise canceling sinking current to the PLL circuit comprises applying the noise canceling sinking current to the charge pump output current.

23. The method of claim 21, further comprising generating a sign signal indicative of a polarity of the noise canceling correction, and wherein applying the noise canceling sourcing current and applying the noise canceling sourcing current comprises controlling current application in response to the sign signal.

24. The method of claim 21, further comprising generating a digital code signal indicative of a magnitude of a noise canceling correction, applying the noise canceling sourcing current and applying the noise canceling sourcing current comprises controlling a magnitude of the current application in response to the digital code.

* * * * *